United States Patent
Shastry et al.

(10) Patent No.: US 7,576,627 B2
(45) Date of Patent: Aug. 18, 2009

(54) ELECTRONICALLY TUNABLE ACTIVE DUPLEXER

(75) Inventors: Prasad Narasimha Shastry, Washington, IL (US); Balamurugan Sundaram, Peoria, IL (US)

(73) Assignee: Bradley University, Peoria, IL (US)

( * ) Notice: Subject to any disclaimer, the term of this patent is extended or adjusted under 35 U.S.C. 154(b) by 100 days.

(21) Appl. No.: 11/738,852

(22) Filed: Apr. 23, 2007

(65) Prior Publication Data

US 2007/0247257 A1  Oct. 25, 2007

Related U.S. Application Data

(60) Provisional application No. 60/794,378, filed on Apr. 24, 2006.

(51) Int. Cl.
  *H03H 7/48* (2006.01)
  *H01P 5/12* (2006.01)

(52) U.S. Cl. .................. 333/132; 333/126; 333/129; 330/286

(58) Field of Classification Search .......... 333/126, 333/129, 132; 330/286
  See application file for complete search history.

(56) References Cited

U.S. PATENT DOCUMENTS

| | | | |
|---|---|---|---|
| 4,001,524 A | | 1/1977 | Prudhon |
| 4,127,750 A | | 11/1978 | Prudhon |
| 4,792,939 A | | 12/1988 | Hikita |
| 5,046,155 A | * | 9/1991 | Beyer et al. ............... 330/54 |
| 6,262,673 B1 | | 7/2001 | Kalina |
| 6,472,952 B1 | | 10/2002 | Sakai |
| 6,492,883 B2 | | 12/2002 | Liang |
| 6,784,837 B2 | | 8/2004 | Revankar et al. |
| 7,414,477 B2 | * | 8/2008 | Joodaki ..................... 330/286 |

OTHER PUBLICATIONS

J. B. Beyer, S. N. Prasad (Prasad N. Shastry), J. E. Nordman, R. C. Becker and G. Hohenwarter, "MESFET distributed amplifier design guidelines," IEEE Trans. Microwave Theory and Tech, vol. MTT32, No. 3, pp. 268-275, 1984.

S. N. Prasad (Prasad N. Shastry) and Z. M. Li, "Optimal design of low crosstalk, wideband, bidirectional distributed amplifiers," 1996 IEEE MTT-S Int. Microwave Symp. Dig., San Francisco, California, Jun. 1996, pp. 847-850.

S. N. Prasad (Prasad N. Shastry), Jalmi-Abdul Jalil, and Tuan Tu, "A 2.4 GHz T/R module for wireless transceiver applications," focused session on U.S. Wireless Technology, MTT-S European Wireless '98, Amsterdam, Oct. 1998, pp. 237-242.

(Continued)

*Primary Examiner*—Benny Lee
*Assistant Examiner*—Kimberly E Glenn
(74) *Attorney, Agent, or Firm*—Sonnenschein, Nath and Rosenthal LLP; Marcellus A. Chase

(57) ABSTRACT

This invention provides a novel electronically tunable active duplexer for wireless transceiver applications. It relates to an active duplexer with full-duplex operation, permitting simultaneous transmission and reception of signals at same or different frequencies. It incorporates varactors, instead of fixed or mechanically adjustable capacitors, in phase shifting networks enabling one to electronically tune, with ease and precision, the frequency at which isolation is desired, over a band in both transmit and receive modes of operations. It can be implemented as a Monolithic Microwave Integrated Circuit (MMIC).

37 Claims, 22 Drawing Sheets

OTHER PUBLICATIONS

Sameer Naik, "PCS CDMA Receiver Front-end," Master's Research Project Report, Dept. of Electrical & Computer Engineering, Bradley University, Peoria, Illinois, U.S.A., 1999.

Balamurugan Sundaram, "Reconfigurable Active Duplexer for Wireless Systems", Master's Research Project Report, Dept. of Electrical and Computer Engineering, Bradley University, Peoria, Illinois, U.S.A., 2005.

S. N. Prasad (Prasad N. Shastry), "Microwave Impedance Matching Techniques", Handbook of Microwave Technology, San Diego, California, Academic Press, 1995, Ch. 17, pp. 617-669.

S. Balamurugan and P Shastry, "A novel electronically tunable active duplexer for wireless transceiver applications," in Proceedings of the 35th European Microwave Conference, Paris, France, Oct. 2005, pp. 1767-1770.

S. Balamurugan and P Shastry, "A novel electronically tubale active duplexer for wireless transceiver applications," ZEEE Transactions on Microwave Theory And Techniques, vol. 54, No. 6, Jun. 2006, pp. 2584-2592.

* cited by examiner

ELECTRONICALLY TUNABLE ACTIVE DUPLEXER

PARENT CASE TEXT

This patent application claims priority to provisionial patent application No. 60/794,378, which was filed on Apr. 24, 2006.

BACKGROUND OF THE INVENTION

1. Field of the Invention

This invention relates to a transceiver antenna, especially an electronically tunable active duplexer for wireless transceiver applications. Specifically, it relates to an active duplexer comprising one or more varactors to allow for continuous electronic tuning, which permits the simultaneous transmission and reception of signals at same or different frequencies.

2. Description of Related Art

A duplexer is a critical component in the functioning of wireless transceivers, such as mobile phones, wireless network adapters, and PDAs. It allows simultaneous transmission and reception of signals from a single antenna. It provides isolation between transmitter and receiver.

The duplexers currently generally used in transceivers are passive filters and hence have insertion loss across the device. Furthermore, they are not tunable, or if they are tunable, they are not tunable electronically, and they do not provide amplification of transmitted and received signals.

Bi-Directional Distributed Amplifier

The current state of the art of antenna duplexers are based on bi-directional distributed amplifier (DA) architecture (see reference 1 [infra], which is herein incorporated by reference). A DA is inherently bi-direction al because of the symmetry in its architecture. The signal paths in an exemplary DA are shown in FIG. 1. $S_{21}$ and $S_{34}$ represent the gains in the two directions.

A DA can be designed in such a way to produce low crosstalk between isolated ports, represented by $S_{31}$ and $S_{24}$ (see references 2, 3, and 4 [infra], which are herein incorporated by reference). Specifically, this is achieved by inserting phase shifting networks between the distributed amplifier gain cells (DA cells) to cancel the signals at the isolated ports at a given frequency as shown in FIG. 2 (reference 3). Yet, the active duplexers reported in references 2 and 3 are not tunable. However, the isolation level and frequency can be slightly adjusted in those duplexers by replacing the fixed capacitors in the phase shifting networks (references 2 and 3) with mechanically adjustable capacitors (reference 4).

Antenna Configurations

The functionality of a state-of-the-art active duplexer as a T/R (Transmit/Receive) module with antenna connection options is shown schematically in FIG. 2. Each DA cell is comprised of a Field Effect Transistor (FET) and gate and drain line inductors (reference 1). The tunable phase shifting networks between the DA cells are designed such that the signals arriving at port 3, from port 1 and port 4, through the DA cells are out of phase with each other and hence cancel. Therefore, port 3 is isolated from port 1.

This allows one to connect a transmitter at port 1 and a receiver at port 3. Since a DA is a symmetrical device, cancellation of the signals arriving at port 2 will also occur when a wave enters port 4. Bandpass filters R and T (designed to pass receive and transmit frequencies respectively) may be included to further enhance the isolation between the isolated ports. Various antenna/duplexer configurations can be implemented, which are described below and referenced throughout this disclosure.

Configuration A. Antenna Connected to Ports 2 and 4

If an antenna is connected to ports 2 and 4; in the transmit mode, the signal is amplified from port 1 to port 2. During the receive mode the signal is amplified from port 4 to port 3. The received signal is prevented from entering the transmitting antenna because of isolation between ports 2 and 4. This configuration requires isolation between ports 1 and 3, and ports 2 and 4.

Configuration B. Antenna at Port 4

If an antenna is connected to port 4 with port 2 terminated; in the transmit mode, the signal is attenuated along the gate line of the DA. The attenuation can be overcome by amplifying the signal at port 1. However, during the receive mode, the signal is amplified from port 4 to port 3.

Configuration C. Antenna at Port 2

If an antenna is connected to port 2 with port 4 terminated; in the transmit mode, the signal is amplified from port 1 to port 2. During the receive mode, the signal is attenuated along the drain line. Further, the noise figure of the duplexer increases.

Therefore, ordinarily, this configuration is not a viable option.

Previous Attempts at a Tunable Duplexer

The duplexer field is fairly well enabled by the engineering (infra) as well as the patent literature. For example, U.S. Pat. Nos. 4,001,524, 4,127,750, and 4,792,939 (which are herein incorporated by reference) generally describe duplexers. U.S. Pat. No. 6,472,952, which is herein incorporated by reference, generally describes phase shifters, which are useful in duplexers. U.S. Pat. Nos. 6,262,673 and 6,492,883, which are herein incorporated by reference, generally describe tunable duplexers. U.S. Pat. No. 6,784,837, which is herein incorporated by reference, teaches a transmit/receive module for a high power active phased array antenna system based upon a combination of Hybrid Microwave Integrated Circuit (MIC) as well as Monolithic Microwave Integrated Circuit (MMIC) technology.

The inventors and collaborators have developed related art that serves as a foundation for the instant invention. These are references 1-6, set forth below:

The active duplexer of reference 2 was designed for isolation over a wideband. The Chebyshev scaling of transconductances of transistors in a DA was shown to provide the specified isolation over a large bandwidth. The duplexer provided a gain of 5 dB but the average Transmitter-Receiver isolation was less than 15 dB in the frequency range between 3 and 5 GHz.

The active duplexer of reference 3 was designed with fixed values of capacitances on the gate and drain lines of a DA. The Transmitter-Receiver isolation achieved was about 17 dB and the gain was about 2.6 dB at 2.4 GHz.

The active duplexer of reference 4 provided a gain of 9 dB and a Transmitter-Receiver isolation of about 28 dB at 1.97 GHz. The mechanically tunable capacitors on the gate and drain lines were intended for minute adjustments of the isolation frequency and level of isolation. Many versions of this duplexer were fabricated using mechanically tunable capacitors for improved performance (reference 5), but none of them showed any improvement in isolation level or gain. Moreover, they were found to be unsuitable for repeated operation (by tuning) of the active duplexer over a desired set of frequencies in the tuning range.

All of the foregoing active duplexers (found in references 2, 3, 4, and 5) were designed for antenna configuration B (where an antenna is connected to port 4 and port 2 is terminated). In this configuration, gain is present only in the receive mode and isolation is required only between one pair of isolated ports.

Phase Shift

The required phase shift $\phi$ between the DA cells for obtaining the isolation between ports 1 and 3 in an active duplexer is determined by the number (n) of transistors used.

The phase shift required is given by equation no. 1:

$$\phi = \frac{180}{n} \quad (1)$$

or an integer multiple of $\phi$, except 180 and 360 degrees. For example, if 4 transistors are used for designing an active duplexer the required phase shift between transistors should be any of the following values, $$\phi = \frac{180}{4} = 45,$$

or any one of 90, 135, 225, 270, and 315 degrees.

REFERENCES

The following references are cited by number throughout this disclosure. Applicant makes no statement, inferred or direct, regarding the status of these references as prior art. Applicant reserves the right to challenge the veracity of statements made in these references, which are incorporated herein by reference.

1. J. B. Beyer, S. N. Prasad (Prasad N. Shastry), J. E. Nordman, R. C. Becker and G. Hohenwarter, "MESFET distributed amplifier design guidelines," IEEE Trans. Microwave Theory and Tech, Vol. MTT32, No. 3, pp. 268-275, 1984.

2. S. N. Prasad (Prasad N. Shastry) and Z. M. Li, "Optimal design of low crosstalk, wideband, bidirectional distributed amplifiers," 1996 IEEE MTT-S Int. Microwave Symp. Dig., San Francisco, Calif., June 1996, pp. 847-850.

3. S. N. Prasad (Prasad N. Shastry), Jalmi-Abdul Jalil, and Tuan Tu, "A 2.4 GHz T/R module for wireless transceiver applications," focused session on U.S. Wireless Technology, MTT-S European Wireless '98, Amsterdam, October 1998, pp. 237-242.

4. Sameer Naik, "PCS CDMA Receiver Front-end," Master's Research Project Report, Dept. of Electrical & Computer Engineering, Bradley University, Peoria, Ill., U.S.A., 1999.

5. Balamurugan Sundaram, "Reconfigurable Active Duplexer for Wireless Systems", Master's Research Project Report, Dept. of Electrical and Computer Engineering, Bradley University, Peoria, Ill., U.S.A., 2005.

6. S. N. Prasad (Prasad N. Shastry), "Microwave Impedance Matching Techniques", Handbook of Microwave Technology, San Diego, Calif., Academic Press, 1995, Ch. 17, pp 617-669.

7. S. Balamurugan and P Shastry, "A novel electronically tunable active duplexer for wireless transceiver applications," in *Proceedings of the 35th European Microwave Conference*, Paris, France, October 2005, pp. 1767-1770.

8. S. Balamurugan and P Shastry, "A novel electronically tunable active duplexer for wireless transceiver applications," *IEEE Transactions on Microwave Theory And Techniques*, Vol. 54, No. 6, June 2006, pp. 2584-2592.

SUMMARY OF THE INVENTION

The inventors have developed an electronically tunable active duplexer ("ETAD") for wireless transceiver applications. The ETAD offers improved precision in antenna tuning to obtain higher isolation of a desired frequency and provides repeatable, electronically tunable, isolations over a desired band of frequencies, which is a considerable improvement over the active duplexers described in references 2, 3, and 4. In a preferred embodiment, the ETAD comprises a phase shifting network between distributed amplifier gain cells, wherein the phase shifting network comprises a varactor (7). The incorporation of varactors, instead of fixed or mechanically adjustable capacitors, in phase shifting networks enables one to electronically tune, with ease and precision, the frequency at which isolation is desired, over a band in both transmit and receive modes of operations. Unlike the mechanically adjustable capacitor configuration (reference 4), the varactor-based tunable configuration of this invention allows precise tuning to obtain higher isolation at a desired frequency. More preferably, the distributed amplifier gain cells of the ETAD comprise GaAsFET gate and drain line inductors. Most preferably, the ETAD optionally comprises bandpass filters on both transmission and receiver signal paths. The ETAD can be used in either antenna configuration A or B (supra).

A varactor is a semiconductor diode with the properties of a voltage-dependent capacitor. Specifically, it is a variable-capacitance, pn-junction diode that makes good use of the voltage dependency of the depletion-area capacitance of the diode. An external bias applied to a varactor can affect the magnitude, barrier potential, and width of the depletion area. Enough bias will overcome the barrier potential and cause current to flow through the diode. The width of the depletion region can be controlled by keeping the bias voltage at levels that do not allow current flow. Since the depletion area acts as a capacitor, the diode will perform as a variable capacitor that changes with the applied bias voltage, thus allowing for electronic active tuning of the instant duplexer.

BRIEF DESCRIPTION OF THE DRAWINGS

D1, D2, D3 and D4 each represent a Varactor. V1, V2, V3 and V4 each represent corresponding Varactor Voltages. $V_{ds}$, represents the DC Bias to the transistors.

Figure 10:
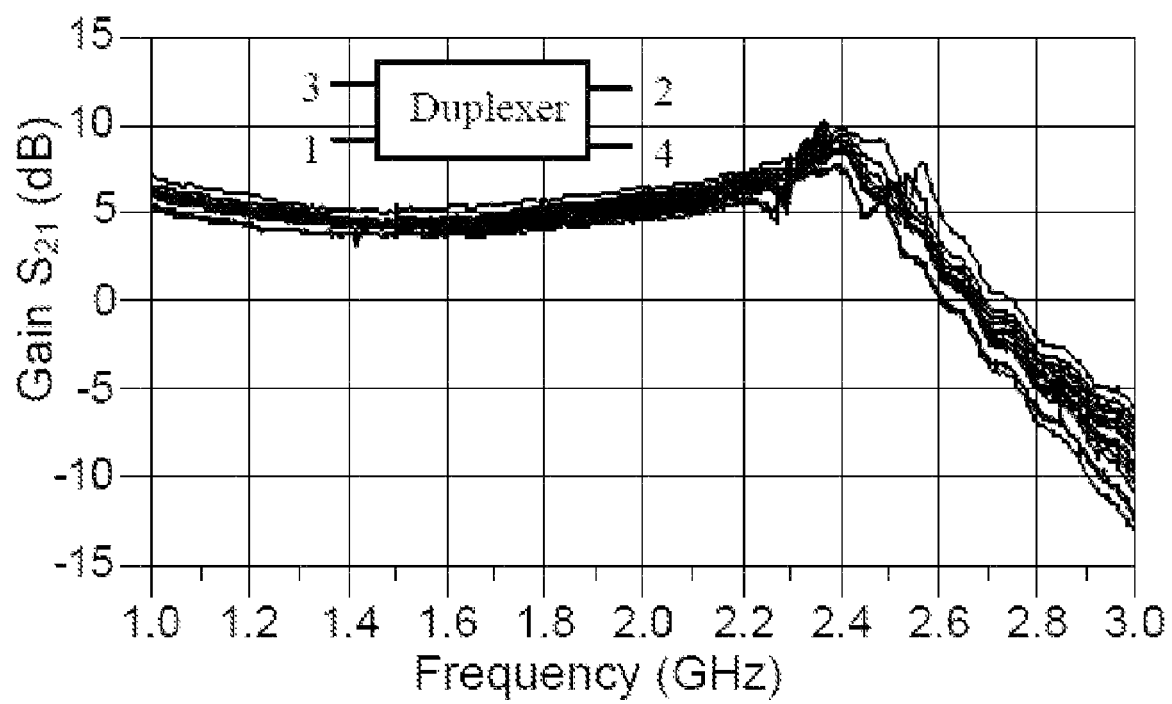
Figure 11:
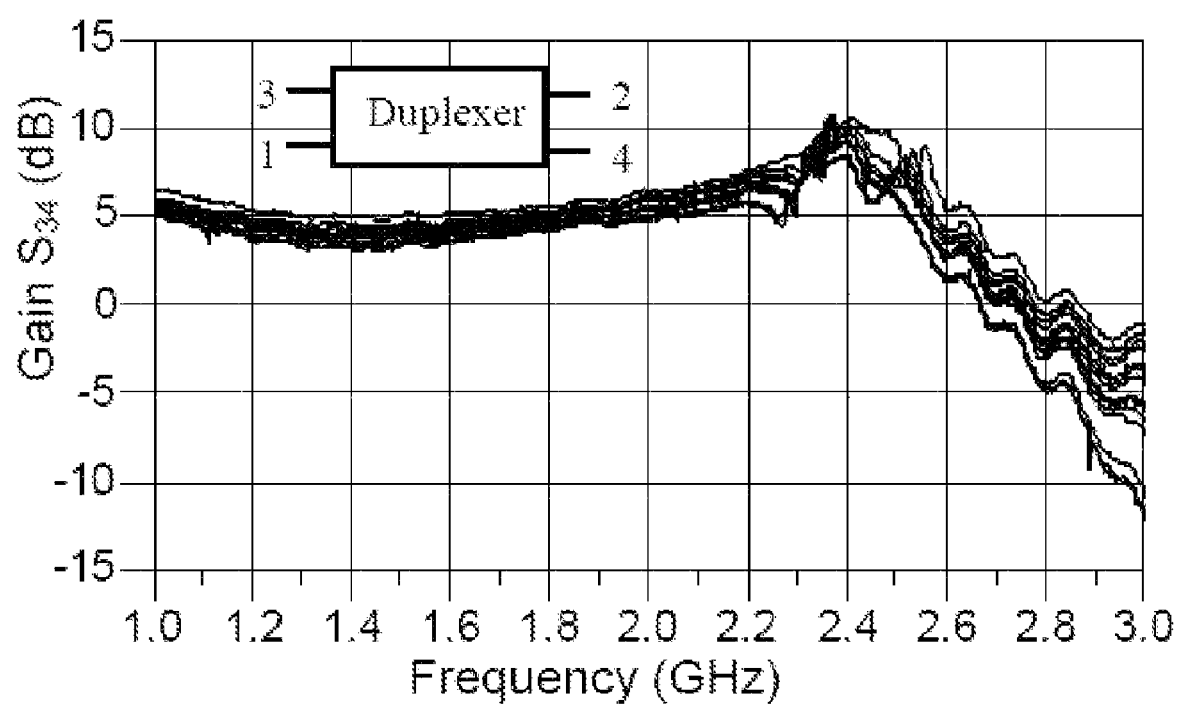
Figure 12:
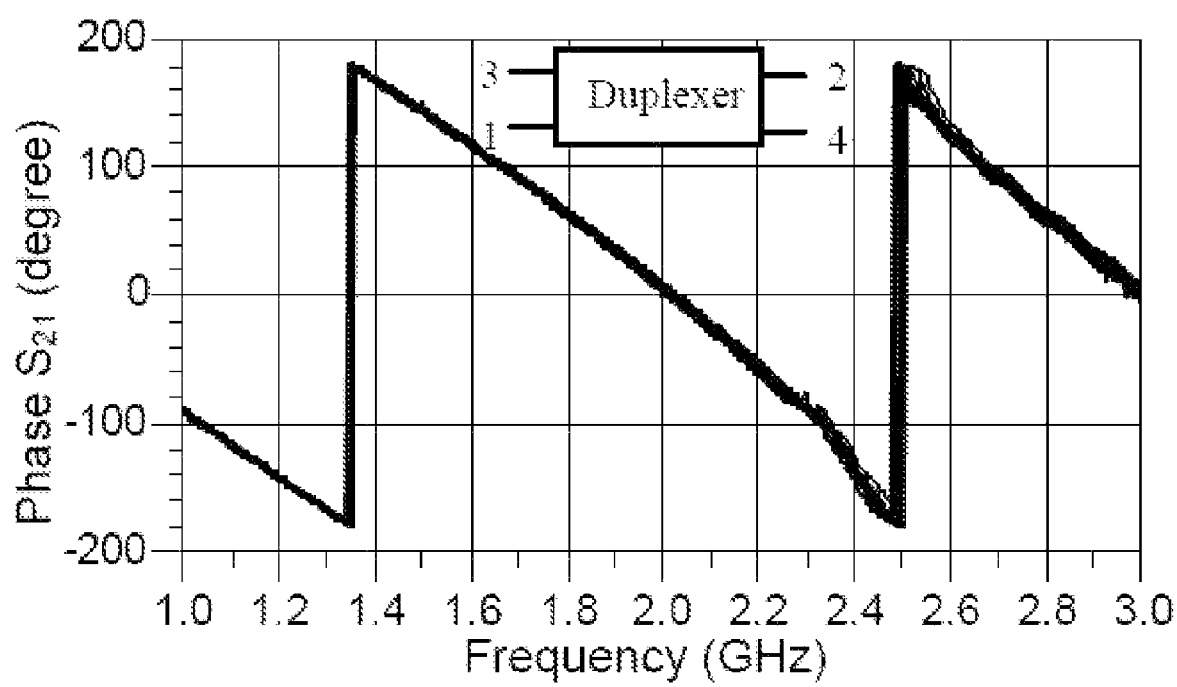
Figure 13:
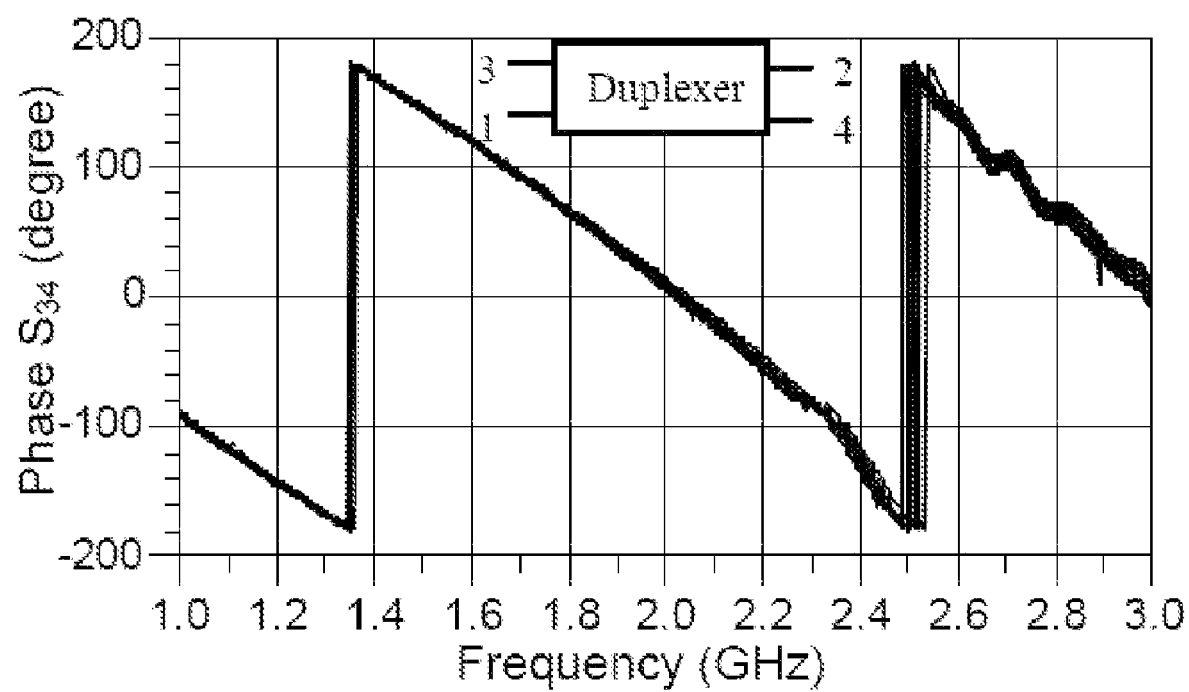
Figure 14:
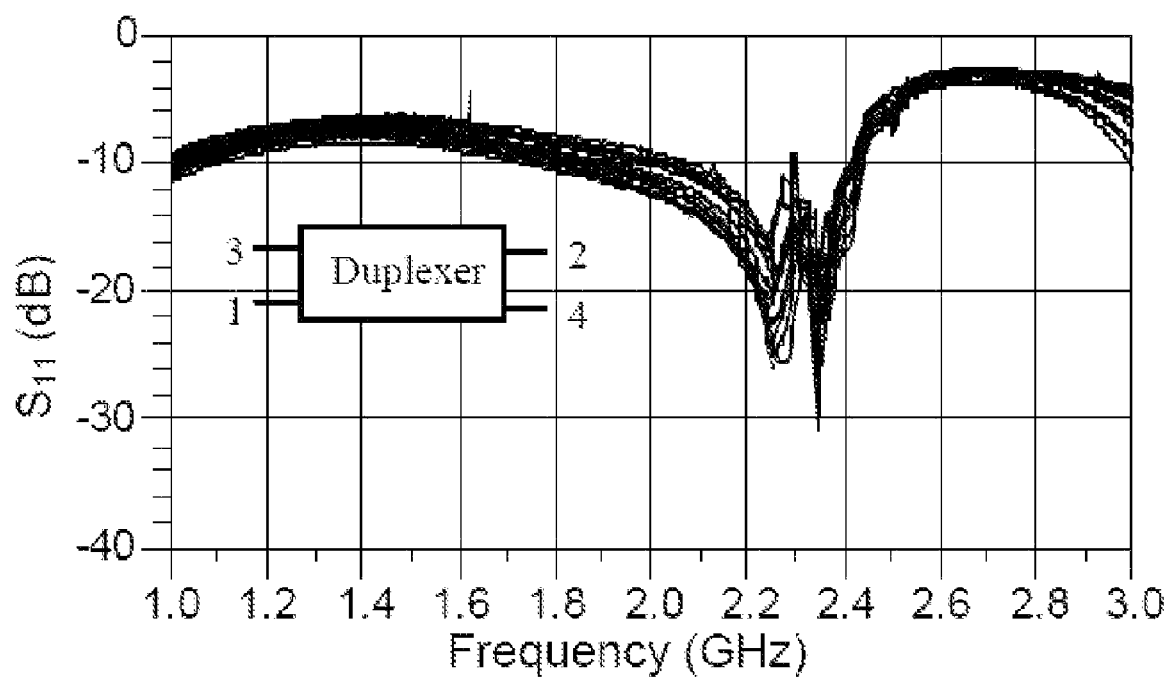
Figure 15:
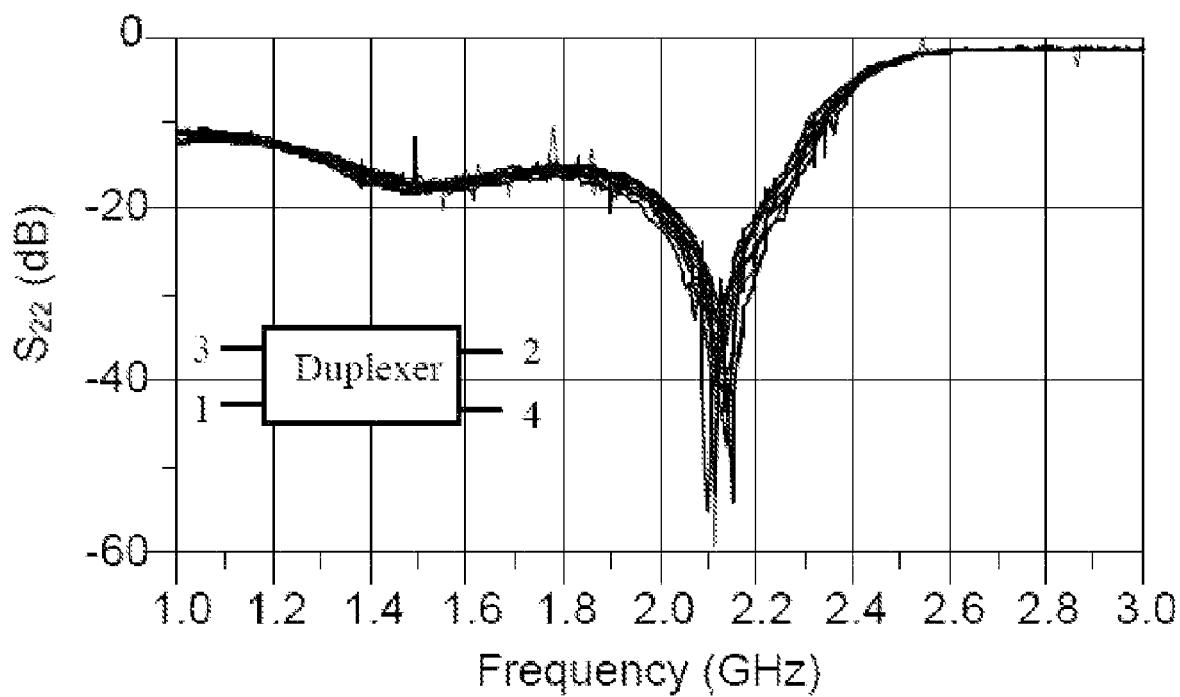
Figure 16:
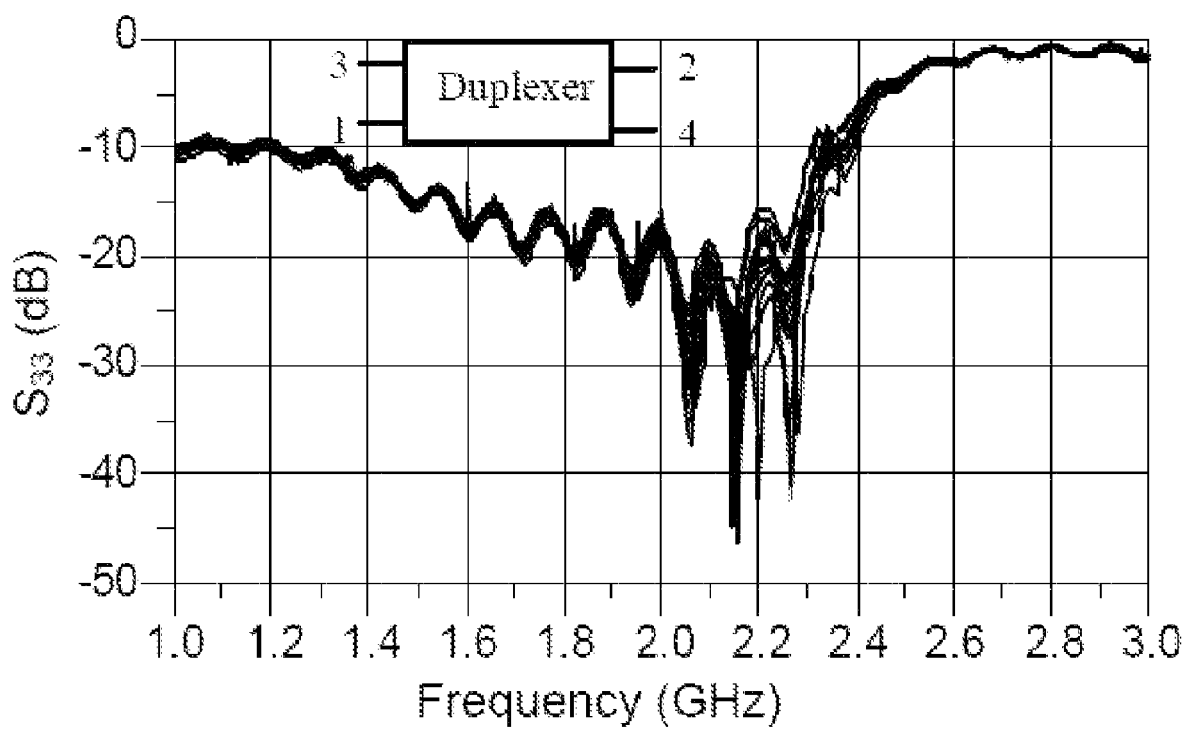
Figure 17:
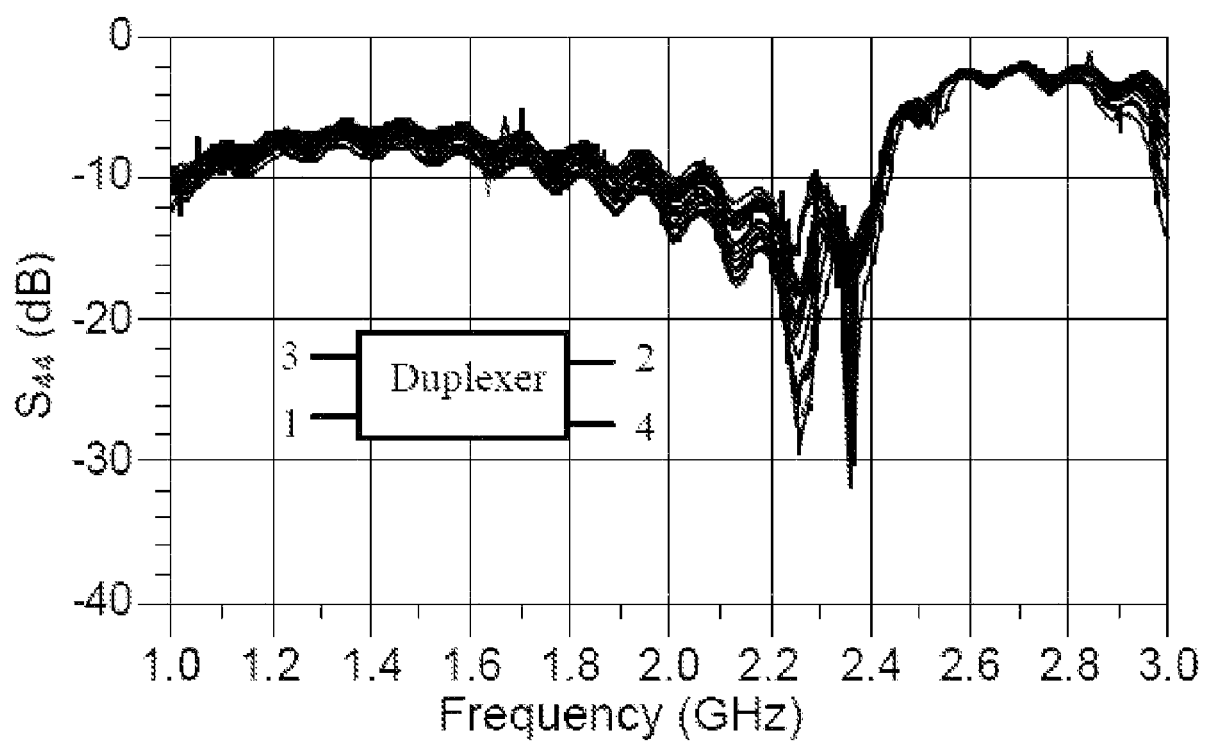

The measured gains in the transmit mode ($S_{21}$) and in the receive mode ($S_{34}$) are shown in FIG. 10 and FIG. 11 respectively. The duplexer has a gain varying from 3.9 to 5.3 dB from 1.62 to 1.82 GHz. The measured phases of transmission coefficients in the transmit mode ($S_{21}$) and in the receive mode ($S_{34}$) are shown in FIG. 12 and FIG. 13 respectively. The phases of transmission coefficients are linear in the frequency range 1 to 2 GHz. The measured return losses at the four ports ($S_{11}$, $S_{22}$, $S_{33}$, and $S_{44}$) are shown in FIG. 14, FIG. 15, FIG. 16, and FIG. 17 respectively. The return losses at all four ports were greater than 9 dB.

Figure 18:
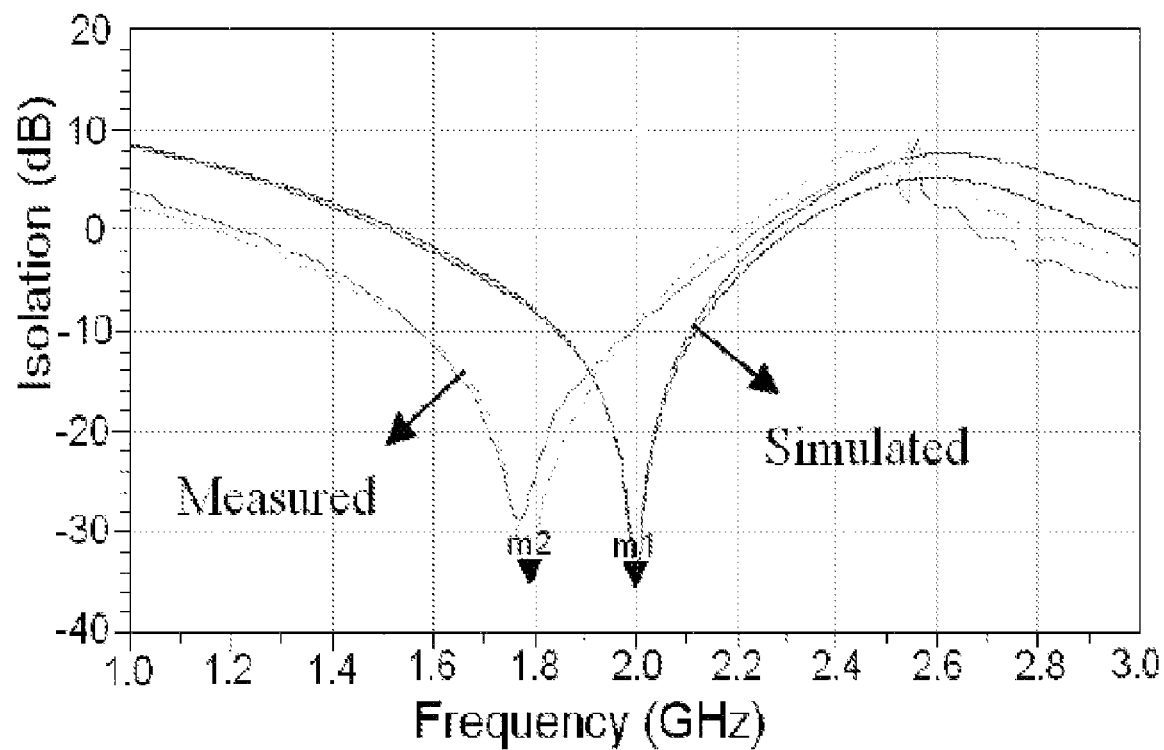

FIG. 18 depicts the measured as well as simulated isolation plots between both pairs of isolated ports of the active duplexer for one set of varactor voltages. A shift in the frequency of isolation is observed.

Figure 19:
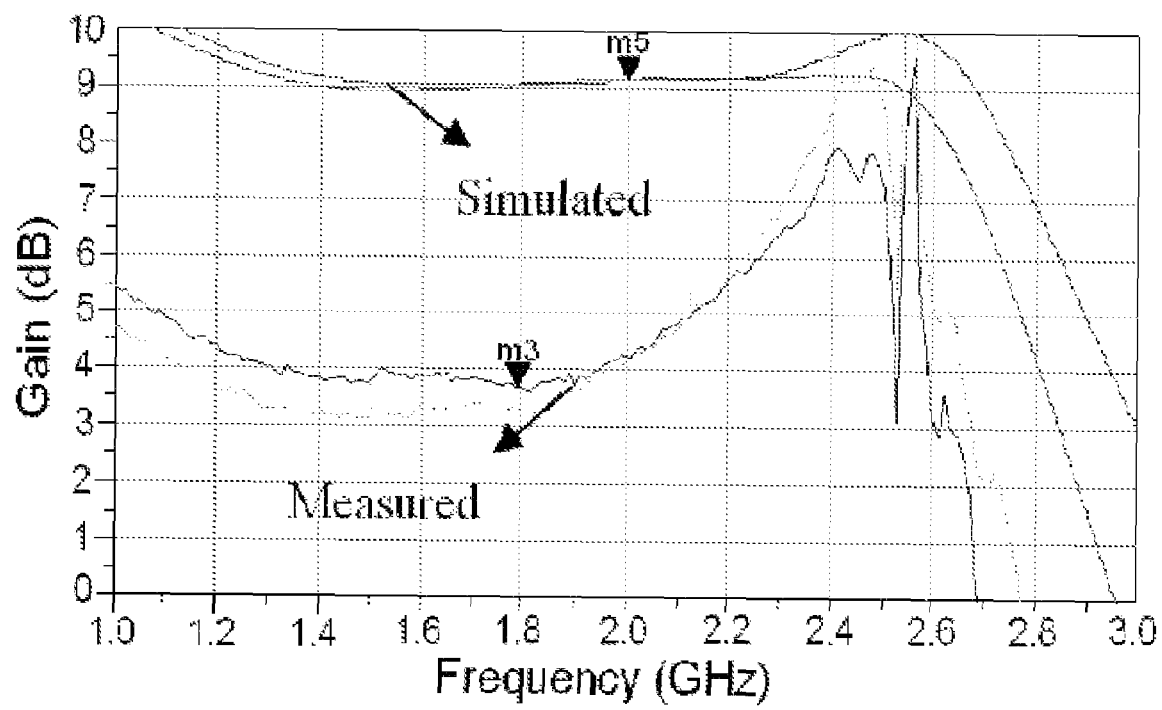

FIG. 19 shows the measured as well as simulated gain plots between both pairs of coupled ports of the active duplexer for one set of varactor voltages. A drop in the measured gain relative to simulated results is observed.

Figure 20:
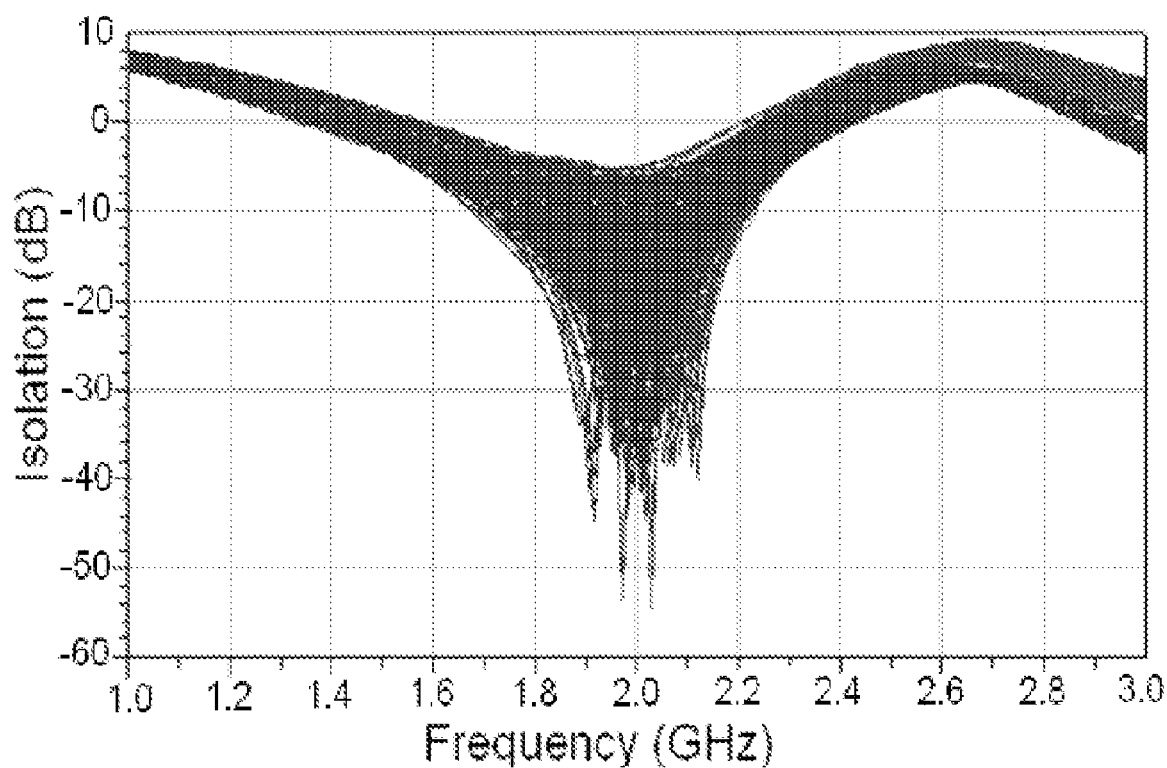

FIG. 20 shows the simulation results of Monte-Carlo analysis for isolation between both pairs of isolated ports at 2.0 GHz.

Figure 21:
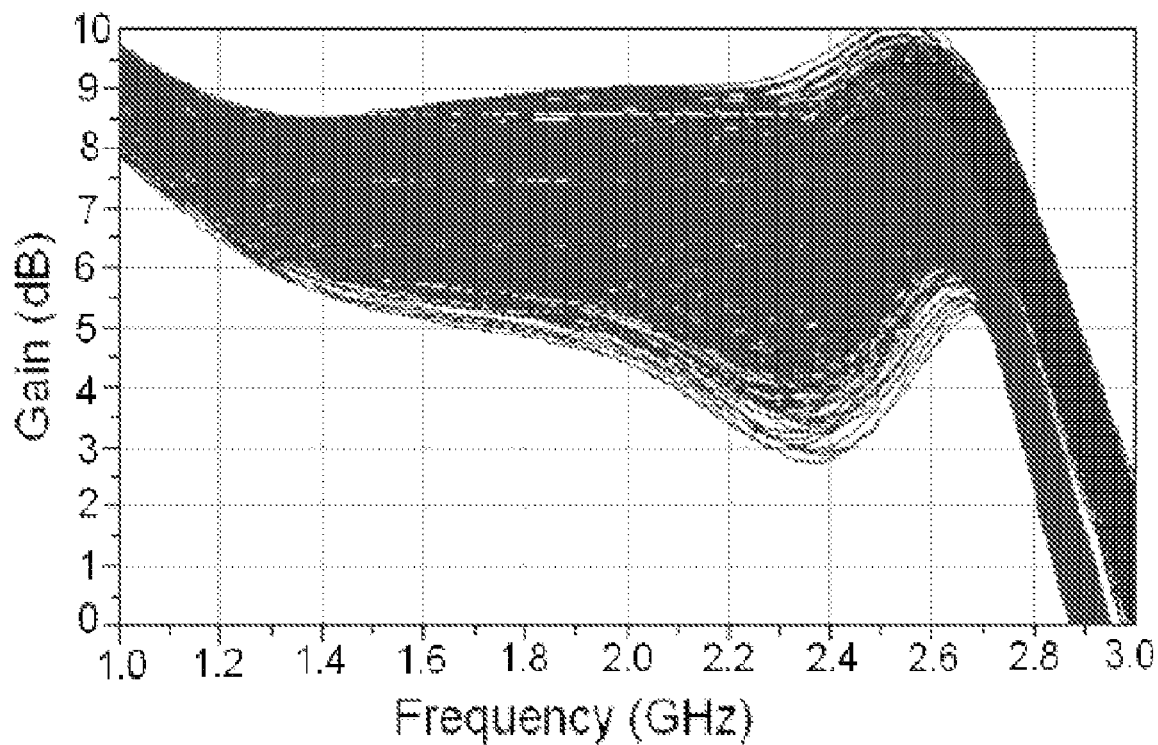

FIG. 21 shows the simulation results of Monte-Carlo analysis for gain between both pairs of coupled ports at 2.0 GHz.

DETAILED DESCRIPTION OF A PREFERRED EMBODIMENT OF THE INVENTION

In one embodiment, the invention is directed to an electronically tunable active duplexer for wireless transceiver applications (8). Wireless transceiver applications include for example 1.9 GHz, 2.4 GHz and 5.8 GHz applications, wireless LAN, mobile phones, wireless network adapters, wireless PDAs, and the like. One skilled in the art can easily appreciate the many additional uses for an electronically tunable active duplexer, as herein disclosed, as well as other permutations, which can be implemented without departing from the spirit and scope of the invention.

Figure 2:
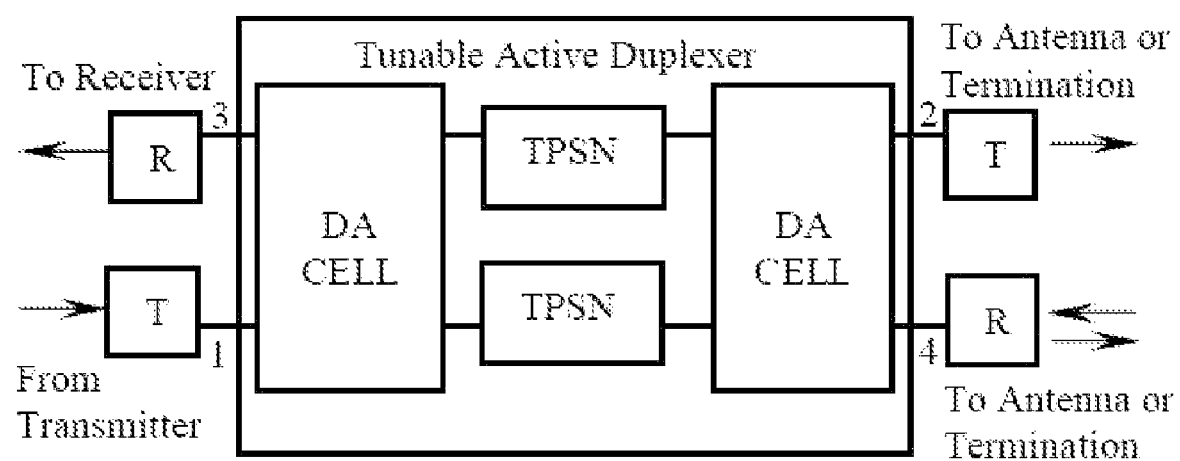
FIG. 2 depicts a Tunable Active Duplexer. Ports 1, 2, 3, and 4 are labeled. Bandpass filters are labeled, T for filters designed to pass transmit signals and R for filters designed to pass receive signals. Tunable Phase Shifting Networks are indicated by TPSN.

The dynamic range, the power handling capability and the noise figure of the active duplexer will depend upon the chosen transistor. In either antenna configuration A or B, tradeoffs between the dynamic range, power handling capability and noise figure will always be present. Moreover, in antenna configuration A the receiver filter R connected to port 4 of the duplexer shown in FIG. 2 is not required if improved noise performance is essential and additional isolation is not necessary. Therefore, the primary advantages of this invention, namely gain in both transmit and receive modes and at the same time isolation between both pairs of isolated ports along with optional antenna configurations, can be utilized appropriately to achieve the desired duplexer specifications.

Figure 3A:
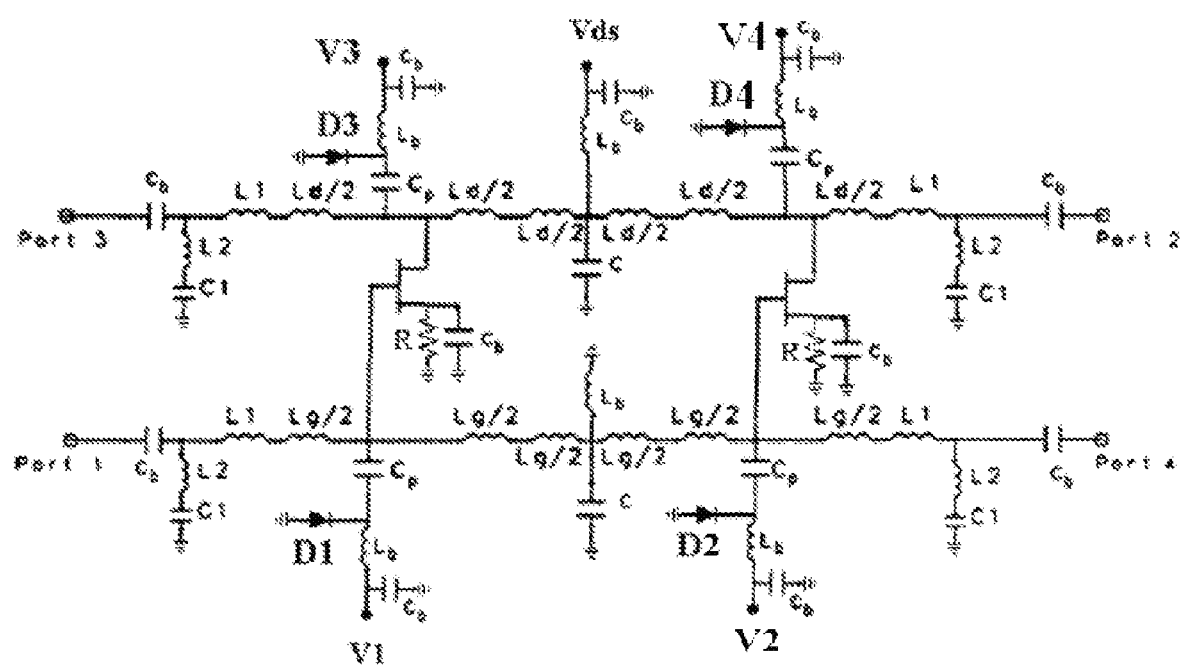
FIG. 3a depicts a circuit diagram of an Electronically Tunable Active Duplexer.

FIG. 3a depicts a circuit diagram of an exemplary Electronically Tunable Active Duplexer ("ETAD"). According to this embodiment, the ETAD comprises two Gallium Arsenide Metal Semiconductor Field Transistors (GaAs MESFETs) (California Eastern Laboratories' NE34018; 400 μm×0.6 μm) employing a unipolar biasing scheme. The transistors were biased at $V_{ds}$=2.0V and $I_{ds}$ (total)=20 mA.

The phase shift (φ) between DA cells is defined by the following equation no. 2:

$$\phi = m\cos^{-1}[1 - 2(f_o/f_c)^2];  \quad (2)$$

where, m is the number of π-sections between transistors, $f_0$ is the frequency at which isolation is desired, and $f_c$, is the cutoff frequency of the gate and drain lines. The gate and drain lines are designed to have the same cutoff frequency and image impedance ($Z_o$) (see reference 1). The m-derived image impedance terminating networks on gate and drain lines were designed as per the guidelines in reference 6.

For a given number of transistors, φ can be calculated from Equation (1). Then, from Equation (2), one can determine the required value of $f_c$, for a given $f_o$, chosen value of m, and calculated value of φ. The gate and drain lines of the DA were designed according to the guidelines in references 1 and 3.

In order to achieve 90 degrees phase shift between the transistors, two (m=2) low-pass π-section filter networks were inserted between transistors on the gate and drain lines. Each π-section offered a phase shift of 45 degrees. The $f_0$, selected was 1.99 GHz. $Z_o$ was chosen to be 50 Ω.

Then the gate and drain line inductor (L) and capacitor (C) values were calculated using the equations from reference 3. C is the effective capacitance between the transistor gate or drain terminal and ground on the gate and drain lines of the distributed amplifier respectively.

Figure 3B:
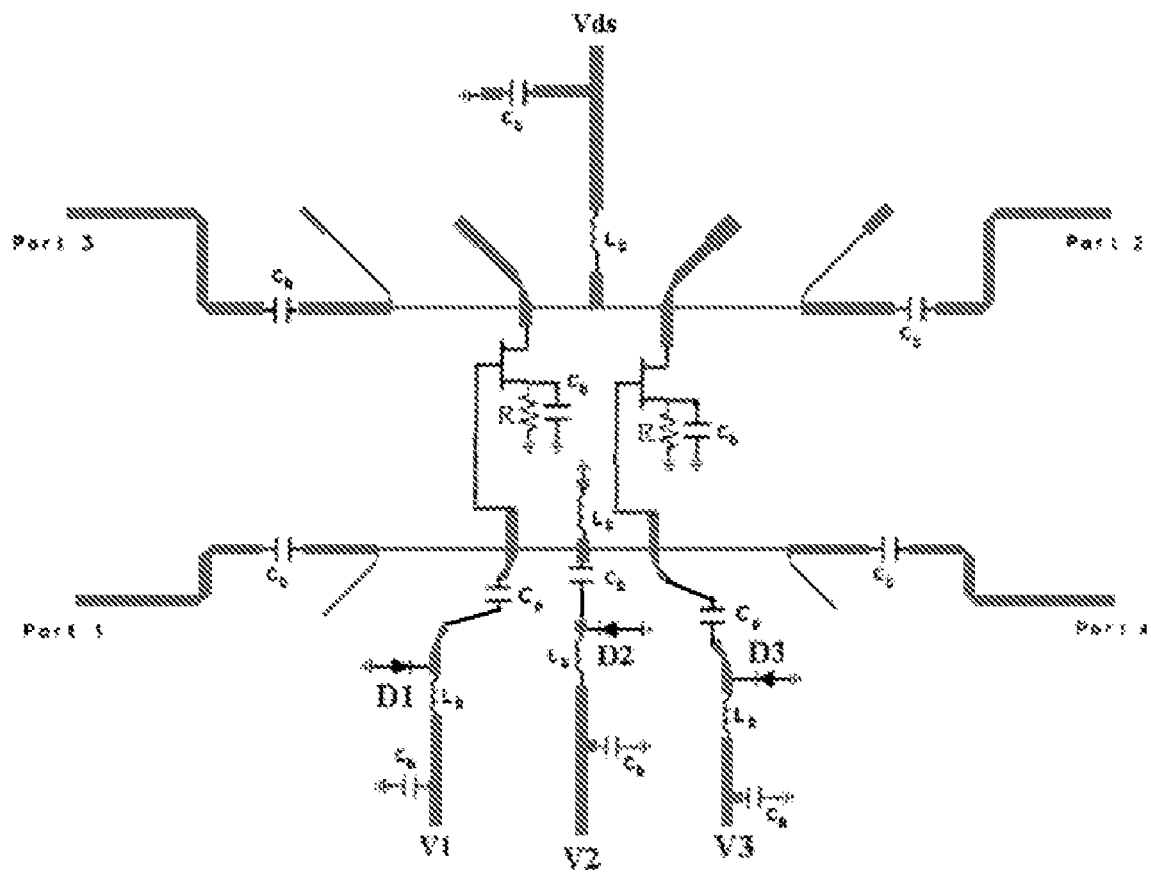
FIG. 3b depicts a schematic of an Electronically Tunable Active Duplexer with microstrip transmission lines. D1, D2, and D3 each represent a Varactor. V1, V2, and V3 each represent corresponding Varactor Voltages. $V_{ds}$ represents the DC Bias to the transistors.

A copper clad RT-Duroid 6002 (Rogers Corp.) circuit board with ∈r =2.94 and thickness of 20 mils was selected for the implementation of the active duplexer. The series inductors and fixed shunt capacitors were implemented using short lengths of high and low impedance microstriplines, respectively. The fixed series capacitors, shunt inductors, and choke inductors were implemented as surface mount components. Three SMV 1405 varactors, from Skyworks Inc., with tunable capacitance range from 0.63 pF to 2.67 pF were used. The schematic circuit diagram of an example of a preferred embodiment of the invention is shown in FIG. 3b. This duplexer was tested for stability using the standard criteria for stability of amplifiers. (Reference 5). This duplexer was found to be unconditionally stable in the range 1 to 3 GHz and beyond.

Figure 1:
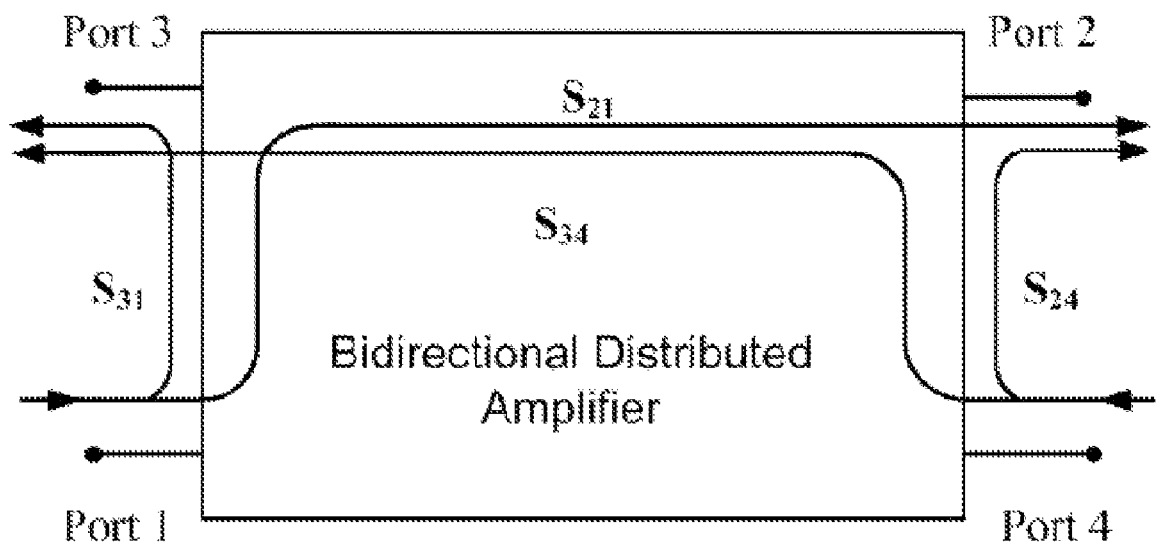
FIG. 1 depicts the signal paths in a distributed amplifier.

In the antenna configuration B, the invention can be operated with isolation either (a) between ports 1 and 3 or (b)

between ports 4 and 2 (FIG. 1) depending on the pair of ports selected to connect the transmitter and receiver to the duplexer.

The invention was operated in antenna configuration B and the isolation plots ($S_{31}$) at various varactor voltage combinations were measured where isolation was achieved between ports 1 and 3. The isolations measured were more than 50 dB in the frequency range 1.67 to 1.87 GHz.

The invention was operated in antenna configuration A, where isolation is required between both pairs of isolated ports. A frequency range from 1.62 to 1.82 GHz was considered since the measured isolations between the isolated ports on both sides of the duplexer were greater than 20 dB in this frequency range. The isolations were between 20 and 52 dB in the tuning range. The gains in the transmit mode ($S_{21}$) and in the receive mode ($S_{34}$) were measured. The duplexer has a gain varying from 3.9 to 5.3 dB from 1.62 to 1.82 GHz. The phases of transmission coefficients in the transmit mode ($S_{21}$) and in the receive mode ($S_{34}$) were measured. The phases of transmission coefficients are linear in the frequency range 1 to 2 GHz. The measured return losses at all four ports ($S_{11}$, $S_{22}$, $S_{33}$, and $S_{44}$) were greater than 9 dB.

The active duplexer in configuration B has higher tunable frequency range and significantly higher average value of isolation compared to configuration A.

The invention was operated in antenna configuration A by applying the appropriate varactor voltages to measure dynamic range. These readings were consistent with the transistor specifications at the bias point where the active duplexer was designed and operated.

When used in configuration A, the prototype invention gave a gain varying from 3.9 to 5.3 dB and isolation ranging from 20 to 52 dB in the tuning range (200 MHz) in both transmit and receive modes of operations. When used in configuration B, the prototype invention gave a gain varying from 4.5 to 6.2 dB in the receive mode and an isolation of above 50 dB at all frequencies in the tuning range (240 MHz). The return losses at all four ports were greater than 9 dB in both configurations. The angles of transmission coefficients in transmit and receive modes in both configurations varied linearly with frequency in the tuning ranges. The measured noise figure in the receive mode varied from 1.77 dB to 2.44 dB in the tuning range. The measured output powers $P1_{dB}$ and IP3 varied between 8.5 and 9.5 dBm and 20 to 29.5 dBm respectively in the tuning range. The proposed duplexer topology is suitable for monolithic implementation.

EXAMPLE

Measured Results

Isolation and Gain

In the antenna configuration B the active duplexer can either be operated with isolation between ports 1 and 3 or between ports 4 and 2 (FIG. 1) depending on the pair of ports selected to connect the transmitter and receiver to the duplexer.

Figure 4:
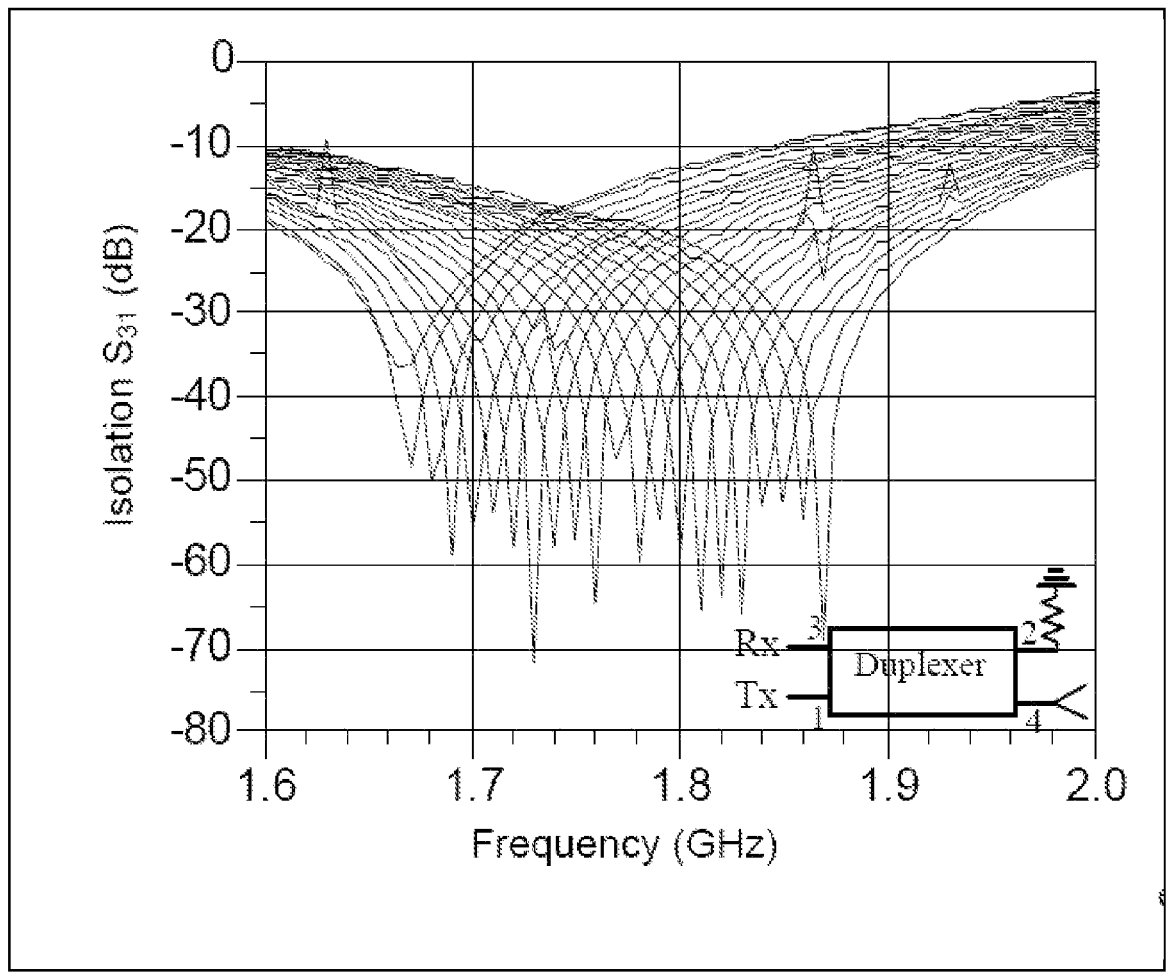
FIG. 4 depicts measured isolation plots ($S_{31}$ of FIG. 1) at various varactor voltage combinations, where the isolation is achieved between ports 1 and 3. The isolations obtained were more than 50 dB in the frequency range 1.67 to 1.87 GHz (Table 1).
Figure 5:
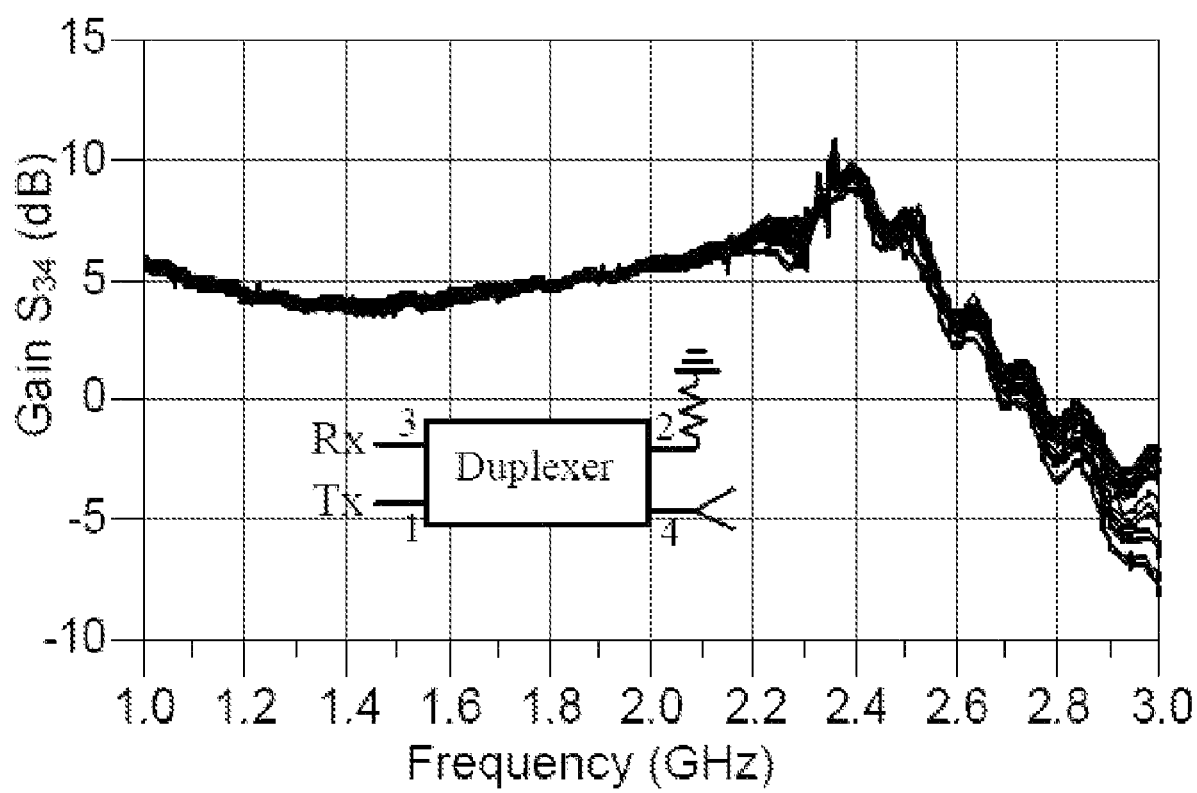
FIG. 5 depicts the measured gains ($S_{34}$ of FIG. 1) in the receive mode at various varactor voltage combinations (Table 1).

When the active duplexer is operated in configuration B, the measured isolation plots ($S_{31}$) at various varactor voltage combinations (Table 1) where the isolation is achieved between ports 1 and 3 are as shown in FIG. 4. The isolations obtained were more than 50 dB in the frequency range 1.67 to 1.87 GHz. The measured gains ($S_{34}$) in the receive mode at various varactor voltage combinations (Table 1) are shown in FIG. 5.

Figure 6:
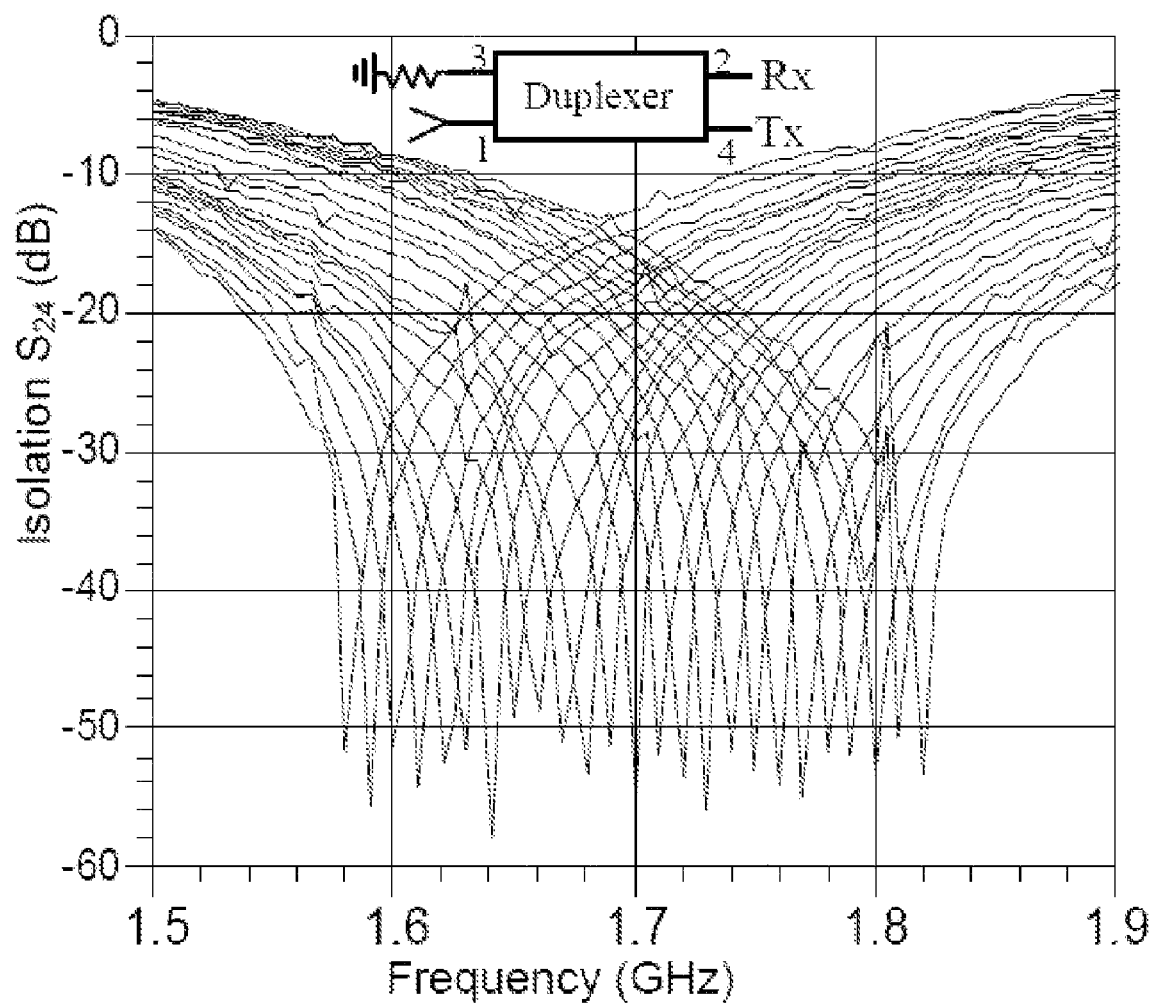
FIG. 6 depicts the measured isolation plots ($S_{24}$ of FIG. 1) at various varactor voltage combinations between ports 2 and 4. The isolations were more than 50 dB in the frequency range 1.58 to 1.82 GHz (Table 2).
Figure 7:
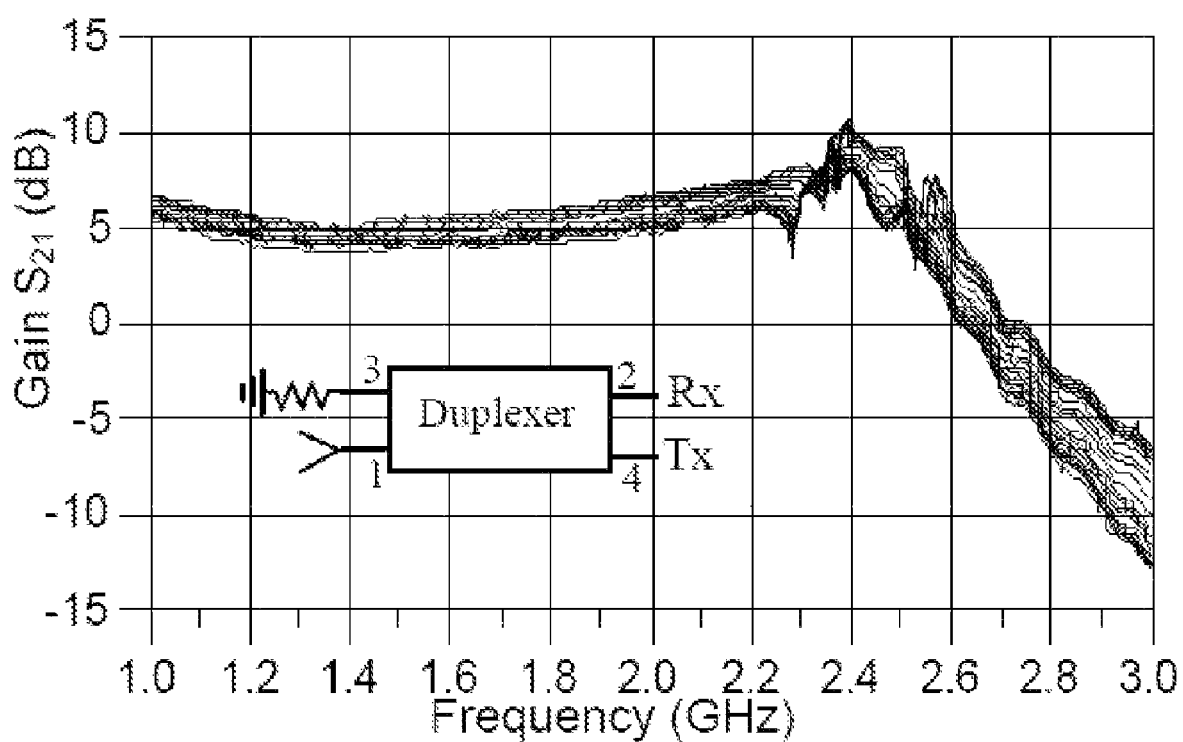
FIG. 7 depicts the measured gains ($S_{21}$ of FIG. 1) in the receive mode at various varactor voltage combinations (Table 2).

FIG. 6 shows the measured isolation plots ($S_{24}$) at various varactor voltage combinations (Table 2) where the isolation is achieved between ports 2 and 4. The isolations were more than 50 dB in the frequency range 1.58 to 1.82 GHz. The measured gains ($S_{21}$) in the receive mode at various varactor voltage combinations (Table 2) are shown in FIG. 7.

A gain varying from 4.5 to 6.2 dB over the tuning range was present during the receive mode in both the foregoing cases in configuration B.

Table 1 shows the values of isolation between ports 1 and 3 and gain in the receive mode between ports 4 and 3 at various varactor voltage combinations in configuration B. Table 2 shows the values of isolation between ports 2 and 4 and gain in the receive mode between ports 1 and 2 at various varactor voltage combinations in configuration B.

TABLE 1

Isolations and gains of tunable active duplexer at various combinations of varactor voltages in configuration B with isolation between ports 1 and 3.

| Varactor Voltages (Volts) | | | Freq | Isolation (dB) | Gain (dB) |
|---|---|---|---|---|---|
| V1 | V2 | V3 | (GHz) | S31 | S34 |
| 1.68 | 6.58 | 0.93 | 1.67 | 48.12 | 4.55 |
| 3.42 | 7.20 | 1.46 | 1.69 | 58.84 | 4.79 |
| 4.25 | 7.40 | 1.93 | 1.71 | 53.97 | 4.55 |
| 2.80 | 8.59 | 2.05 | 1.73 | 71.64 | 4.49 |
| 2.54 | 9.90 | 2.13 | 1.75 | 57.13 | 4.63 |
| 2.29 | 11.85 | 2.22 | 1.77 | 47.34 | 4.66 |
| 2.24 | 13.75 | 2.36 | 1.79 | 54.49 | 4.62 |
| 1.73 | 16.27 | 2.31 | 1.81 | 65.67 | 4.73 |
| 1.80 | 18.90 | 2.41 | 1.83 | 65.77 | 4.90 |
| 1.79 | 23.40 | 2.43 | 1.85 | 52.37 | 5.07 |
| 1.77 | 29.30 | 2.44 | 1.87 | 69.43 | 5.25 |

TABLE 2

Isolations and gains of tunable active duplexer at various combinations of varactor voltages in configuration B with isolation between ports 2 and 4.

| Varactor Voltages (Volts) | | | Freq | Isolation (dB) | Gain (dB) |
|---|---|---|---|---|---|
| V1 | V2 | V3 | (GHz) | S24 | S21 |
| 0.91 | 4.36 | 5.29 | 1.58 | 51.69 | 4.52 |
| 0.92 | 4.23 | 2.60 | 1.60 | 51.47 | 4.15 |
| 1.51 | 4.89 | 2.80 | 1.62 | 52.46 | 4.34 |
| 2.13 | 5.42 | 2.70 | 1.64 | 57.99 | 4.19 |
| 2.14 | 6.18 | 2.40 | 1.66 | 48.86 | 4.18 |
| 2.45 | 6.76 | 2.34 | 1.68 | 53.29 | 4.23 |
| 2.47 | 8.34 | 2.21 | 1.70 | 54.73 | 4.46 |
| 3.48 | 10.3 | 2.21 | 1.72 | 53.69 | 4.62 |
| 6.41 | 14.89 | 2.03 | 1.74 | 51.52 | 5.18 |
| 7.07 | 16.04 | 3.26 | 1.76 | 54.09 | 5.40 |
| 11.32 | 20.40 | 3.36 | 1.78 | 51.55 | 5.69 |
| 14.65 | 24.30 | 3.12 | 1.80 | 53.37 | 5.84 |
| 19.79 | 28.80 | 2.91 | 1.82 | 53.24 | 6.27 |

Figure 8:
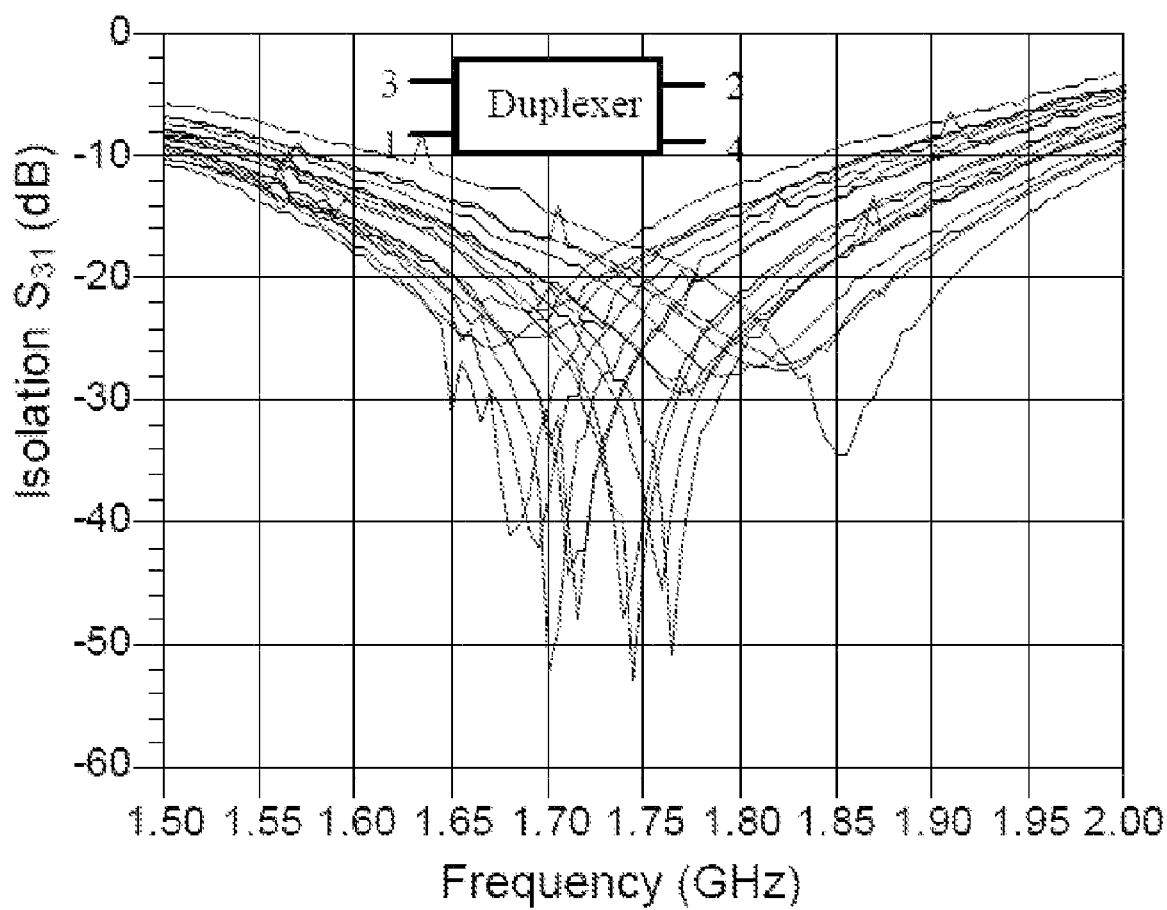
FIG. 8 depicts the measured isolation plots ($S_{31}$) for various varactor voltage combinations (Table 3).
Figure 9:
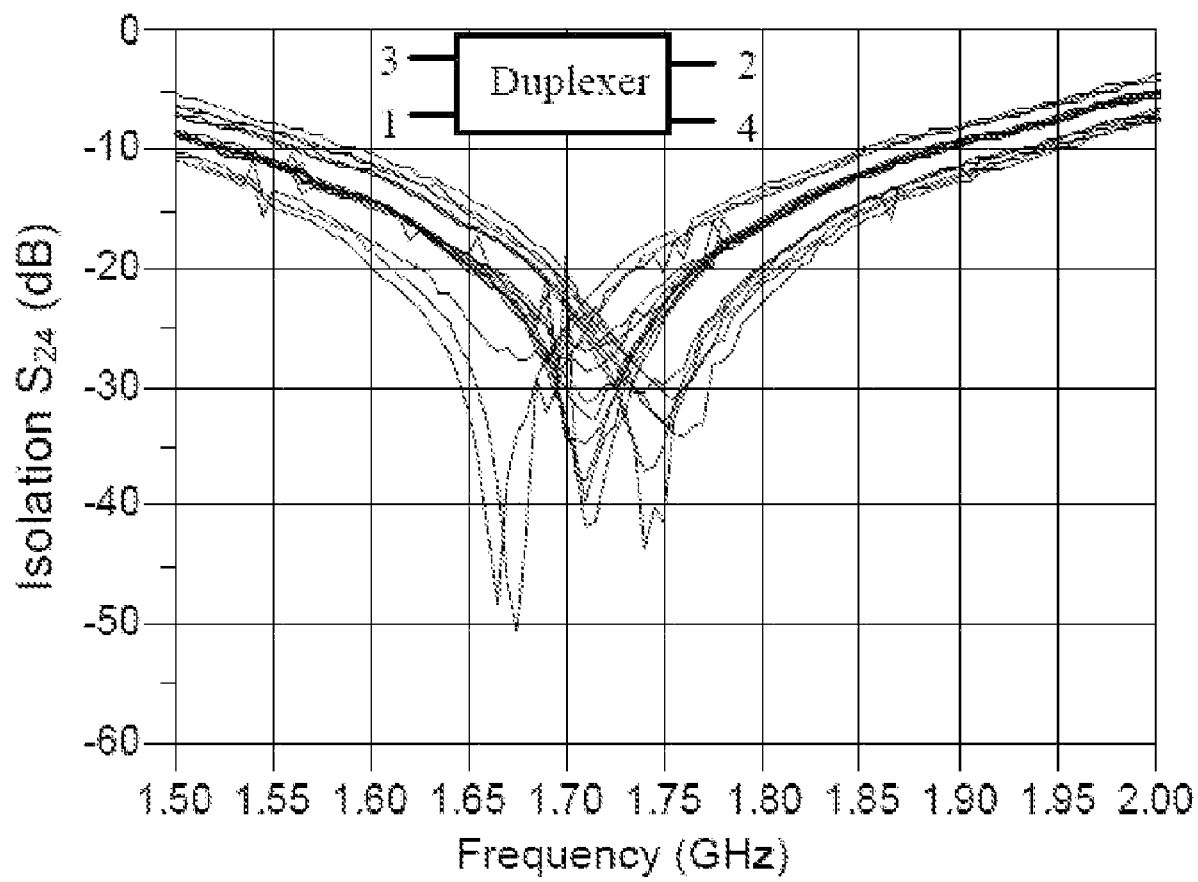
FIG. 9 depicts the measured isolation plots ($S_{24}$) for various varactor voltage combinations (Table 3).

Considering the antenna configuration A, in which isolation is required between both pairs of isolated ports, FIGS. 8 and 9 depict the measured isolation plots ($S_{31}$ and $S_{24}$) for various varactor voltage combinations (Table 3).

A frequency range from 1.62 to 1.82 GHz was considered since the measured isolations between the isolated ports on both sides of the duplexer were greater than 20 dB in this frequency range. The isolations were between 20 and 52 dB in the tuning range.

The measured gains in the transmit mode ($S_{21}$) and in the receive mode ($S_{34}$) are shown in FIG. 10 and FIG. 11 respectively. The duplexer has a gain varying from 3.9 to 5.3 dB from 1.62 to 1.82 GHz. The measured phases of transmission coefficients in the transmit mode ($S_{21}$) and in the receive mode ($S_{34}$) are shown in FIG. 12 and FIG. 13 respectively. The phases of transmission coefficients are linear in the frequency range 1 to 2 GHz. The measured return losses at the four ports ($S_{11}$, $S_{22}$, $S_{33}$, and $S_{44}$) are shown in FIG. 14, FIG. 15, FIG. 16, and FIG. 17 respectively. The return losses at all four ports were greater than 9 dB.

Table 3 shows the values of isolation and gain in the transmit and receive modes of operations in configuration A. The active duplexer in configuration B has higher tunable frequency range and significantly higher average value of isolation compared to configuration A.

TABLE 3

Isolations and gains of tunable active duplexer at various combinations of varactor voltages in configuration A.

| Varactor Voltages (Volts) | | | Freq | Isolation (dB) | | Gain (dB) | |
|---|---|---|---|---|---|---|---|
| V1 | V2 | V3 | (GHz) | S31 | S24 | S21 | S34 |
| 1.24 | 6.36 | 1.39 | 1.67 | 23.48 | 45.85 | 3.9 | 3.87 |
| 2.51 | 6.9 | 1.39 | 1.68 | 41.09 | 22.5 | 3.96 | 4.56 |
| 2.51 | 7.31 | 1.48 | 1.69 | 40.76 | 25.4 | 4.22 | 4.64 |
| 2.51 | 7.71 | 1.59 | 1.7 | 52 | 29.66 | 4.24 | 453 |
| 2.51 | 8.18 | 1.84 | 1.72 | 42.74 | 33.27 | 4.45 | 4.48 |
| 2.5 | 9.45 | 1.97 | 1.73 | 35.09 | 31.16 | 4.65 | 4.54 |
| 2.55 | 10.48 | 2.16 | 1.75 | 37.03 | 23.81 | 4.85 | 4.7 |
| 2.16 | 11.43 | 2.08 | 1.76 | 39.2 | 21.05 | 5 | 4.73 |
| 5 | 17.05 | 1.9 | 1.8 | 26.66 | 20.9 | 5.29 | 5.2 |

Dynamic Range

Table 4 shows the measured output powers at the one dB gain compression point (P1dB) and the third order intercept point (IP3) at various frequencies. The active duplexer was operated in configuration A by applying the appropriate varactor voltages during these measurements. These readings were consistent with the transistor specifications at the bias point where the active duplexer was designed and operated.

TABLE 4

Measured dynamic range of active duplexer in configuration A.

| Varactor Voltages (Volts) | | | Freq | P1dB Out | IP3 Out |
|---|---|---|---|---|---|
| V1 | V2 | V3 | (GHz) | (dBm) | (dBm) |
| 1.13 | 5.55 | 0.93 | 1.64 | 9.5 | 21.5 |
| 2.50 | 9.45 | 1.97 | 1.73 | 9.0 | 20.0 |
| 7.87 | 21.7 | 1.72 | 1.82 | 8.5 | 29.5 |

Noise Figure

The measured noise figures at various combinations of varactor voltages are presented in Table 5. These noise figures were measured both in configuration A and B. The varactor voltages were applied in such a way that the active duplexer operated in either configuration A or B. The measured noise figures compared well with the simulated noise figures presented in reference 5.

TABLE 5

Measured noise figures of tunable active duplexer at various combinations of varactor voltages for configurations A and B.

| Varactor Voltages (Volts) | | | Freq | Isolation | Noise Figure |
|---|---|---|---|---|---|
| V1 | V2 | V3 | (GHz) | achieved | (dB) |
| 1.68 | 6.58 | 0.93 | 1.67 | $S_{31}$ | 1.77 |
| 2.29 | 11.85 | 2.22 | 1.77 | $S_{31}$ | 2.39 |
| 1.77 | 29.30 | 2.44 | 1.87 | $S_{31}$ | 2.18 |
| 0.91 | 4.36 | 5.29 | 1.58 | $S_{24}$ | 1.82 |
| 2.47 | 8.34 | 2.21 | 1.70 | $S_{24}$ | 2.44 |
| 19.79 | 28.8 | 2.91 | 1.82 | $S_{24}$ | 2.42 |
| 1.13 | 5.55 | 0.93 | 1.64 | $S_{31}$ & $S_{24}$ | 1.76 |
| 2.50 | 9.45 | 1.97 | 1.73 | $S_{31}$ & $S_{24}$ | 2.30 |
| 7.87 | 21.7 | 1.72 | 1.82 | $S_{31}$ & $S_{24}$ | 1.89 |

Choice of Configurations and Implications

The dynamic range, the power handling capability and the noise figure of the active duplexer will depend upon the chosen transistor. In either configuration A or B, tradeoffs between the dynamic range, power handling capability and noise figure will always be present. Moreover, in configuration A the receiver filter R connected to port 4 of the duplexer shown in FIG. 2 is not required if improved noise performance is essential and additional isolation is not necessary. Therefore, the primary advantages of the instant electronically tunable active duplexer (ETAD) is a gain in both transmit and receive modes and at the same time isolation between both pairs of isolated ports along with antenna configurations can be utilized appropriately to achieve the desired duplexer specifications.

Yield Analysis

Yield analysis and Monte-Carlo simulations were performed to understand the sensitivity of the performance characteristics of the tunable active duplexer to variations in the various parameters in the design. FIG. 18 shows the measured as well as simulated isolation plots between both pairs of isolated ports of the active duplexer for one set of varactor voltages. FIG. 19 shows the measured as well as simulated gain plots between both pairs of coupled ports of the active duplexer for one set of varactor voltages. In FIG. 18 a shift in the frequency of isolation and in FIG. 19 a drop in the measured gain relative to simulated results can be observed.

In the yield and Monte-Carlo analysis using ADS, variations in the parameters of the fabricated active duplexer were included. The variations included were tolerances of lumped capacitors, inductors, resistors, circuit fabrication processes, dielectric constant of the substrate, lengths of solid vias, parasitics in the non-linear model of the transistor and varactor, thickness of the conductor and such.

Monte-Carlo analysis simulates the performance characteristics of the circuit for a specified number of iterations. In each of these iterations it randomly chooses one value of the tolerance within the specified range for all the variables specified. The result is a set of plots for various iterations.

FIG. 20 shows the simulation results of Monte-Carlo analysis for isolation between both pairs of isolated ports at 2.0 GHz. FIG. 21 shows the simulation results of Monte-Carlo analysis for gain between both pairs of coupled ports at 2.0 GHz. The range of possible outputs for different tolerance combinations of various parameters can be observed. The simulations revealed that the response of the circuit was most sensitive to the length of solid vias. Copper wires soldered to ground through holes drilled on the substrate were used as vias.

The measured noise figure in the receive mode varied from 1.77 dB to 2.44 dB in the tuning range. The measured output powers P1dB and IP3 varied between 8.5 and 9.5 dBm and 20 to 29.5 dBm respectively in the tuning range. The proposed duplexer topology is suitable for monolithic implementation.

What is claimed is:

1. A duplexer comprising a first port, a second port, a third port, a fourth port, at least two distributed amplifier DA gain cells, and at least one tunable phase shifting network TPSN between and connecting the DA cells, wherein the TPSN comprises one or more tunable capacitors.

2. The duplexer of claim 1, wherein the duplexer is electronically tunable.

3. The duplexer of claim 1, wherein the one or more tunable capacitors are one or more varactors.

4. The duplexer of claim 3, wherein each of said DA cell comprises at least one signal amplifying device, resistor, inductor and capacitor.

5. The duplexer of claim 4, wherein each of said DA cell comprises a field effect transistor (FET) and gate and drain line inductors.

6. The duplexer of claim 5, wherein the FET is a gallium arsenide metal semiconductor field effect transistor GaAsMESFET.

7. The duplexer of claim 4 wherein the at least one inductor and the at least one capacitor are lumped elements.

8. The duplexer of claim 4 wherein the at least one inductor and the at least one capacitor are transmission lines.

9. The duplexer of claim 1, further comprising a receiver R bandpass filter connected to the third port or to the fourth port.

10. The duplexer of claim 1, further comprising a transmission T bandpass filter connected to the first port or to the second port.

11. The duplexer of claim 1, wherein an antenna is connected to the fourth port and the second port is terminated.

12. The duplexer of claim 1, wherein an antenna is connected to the second port and the fourth port is terminated.

13. The duplexer of claim 1, wherein an antenna is connected to both the second and fourth ports.

14. The duplexer of claim 2, wherein the one or more tunable capacitors are one or more varactors.

15. The duplexer of claim 14, wherein each of said DA cell comprises at least one signal amplifying device, resistor, inductor and capacitor.

16. The duplexer of claim 15, wherein each of said DA cell comprises a field effect transistor (FET) and gate and drain line inductors.

17. The duplexer of claim 16, wherein the FET is a GaAsMESFET.

18. The duplexer of claim 14, further comprising a receiver (R) bandpass filter connected to the third port or to the fourth port.

19. The duplexer of claim 14, further comprising a transmission (T) bandpass filter connected to the first port or to the second port.

20. The duplexer of claim 1 comprising a copper clad circuit board.

21. The duplexer of claim 1 comprising a plurality of series inductors of high impedance microstripelines.

22. The duplexer of claim 1 comprising a plurality of fixed shunt capacitors of low impedance microstripelines.

23. The duplexer of claim 1 comprising three varactors having a tunable capacitance range from about 0.63 pF to about 2.67 pF and operating in a frequency range of 1.58 to 1.88 GHz.

24. An electronically tunable active duplexer comprising (a) a first port, (b) a second port, (c) a third port, (d) a fourth port, (e) two distributed amplifier gain DA cells, each of which comprises a gallium arsenide metal semiconductor field effect transistor GaAsMESFET and gate and drain line inductors, (f) a tunable phase shifting network TPSN, which comprises at least one varactor and is located between and connecting the DA cells.

25. The electronically tunable active duplexer of claim 24 comprising a copper clad circuit board, series inductors of high impedance microstripelines, fixed shunt capacitors of low impedance microstripelines, and three varactors having a tunable capacitance range from about 0.63 pF to about 2.67 pF and operating in a frequency range of 1.58 to 1.88 GHz.

26. An electronically tunable active duplexer, comprising two tunable phase shifting networks TPSN, two distributed amplifier DA gain cells, a first port for transmission of a signal, a second port for antenna or termination, a third port for receiving a signal, a fourth port for antenna or termination, wherein each of said TPSN comprises one or more tunable capacitors and one or more inductors.

27. The electronically tunable active duplexer of claim 26 wherein the one or more tunable capacitors are one or more varactors.

28. The electronically tunable active duplexer of claim 27, wherein each of said DA cell comprises at least one signal amplifying device, resistor, inductor and capacitor.

29. The electronically tunable active duplexer of claim 28, wherein each of said DA cell comprises a field effect transistor (FET) and gate and drain line inductors.

30. The electronically tunable active duplexer of claim 29, wherein the FET is a gallium arsenide metal semiconductor field effect transistor GaAsMESFET.

31. The electronically tunable active duplexer of claim 28 wherein the at least one inductor and the at least one capacitor are lumped elements.

32. The electronically tunable active duplexer of claim 28 wherein the at least one inductor and the at least one capacitor are transmission lines.

33. The electronically tunable active duplexer of claim 26 any one of claims 16-20, further comprising a receiver R bandpass filter connected to the third port or to the fourth port.

34. The electronically tunable active duplexer of claim 26, further comprising a transmission T bandpass filter connected to the first port or to the second port.

35. The electronically tunable active duplexer of claim 26, wherein an antenna is connected to the fourth port and the second port is terminated.

36. The electronically tunable active duplexer of claim 26, wherein an antenna is connected to the second port and the fourth port is terminated.

37. The electronically tunable active duplexer of claim 26, wherein an antenna is connected to both the second and fourth ports.

* * * * *